(12) United States Patent
Kato et al.

(10) Patent No.: US 7,238,542 B2
(45) Date of Patent: Jul. 3, 2007

(54) MANUFACTURING METHOD FOR COMPOUND SEMICONDUCTOR DEVICE

(75) Inventors: Yoshiaki Kato, Bizen (JP); Tuneo Yamaguchi, Moriyama (JP); Akiyoshi Tamura, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/927,441

(22) Filed: Aug. 27, 2004

(65) Prior Publication Data

US 2005/0170654 A1 Aug. 4, 2005

(30) Foreign Application Priority Data

Jan. 30, 2004 (JP) ............... 2004-023238

(51) Int. Cl.
*H01L 21/00* (2006.01)
(52) U.S. Cl. ............................................. 438/24
(58) Field of Classification Search ............... 438/695, 438/745, 5, 584, 750; 510/175, 407, 411, 510/512, 415, 506; 134/2–3, 18, 33
See application file for complete search history.

(56) References Cited

U.S. PATENT DOCUMENTS

| | | | | |
|---|---|---|---|---|
| 6,090,635 | A * | 7/2000 | Rothman et al. | 438/24 |
| 6,310,018 | B1 * | 10/2001 | Behr et al. | 510/175 |
| 6,372,700 | B1 * | 4/2002 | Zazerra et al. | 510/175 |
| 6,444,507 | B1 * | 9/2002 | Miyasaka | 438/164 |
| 6,551,409 | B1 | 4/2003 | DeGendt et al. | |
| 6,673,126 | B2 * | 1/2004 | Miyasaka | 29/25.01 |
| 6,746,903 | B2 * | 6/2004 | Miyasaka | 438/149 |
| 6,830,979 | B2 * | 12/2004 | Wada | 438/303 |
| 6,890,846 | B2 * | 5/2005 | Noguchi | 438/622 |

FOREIGN PATENT DOCUMENTS

JP 2001-185520 7/2001

OTHER PUBLICATIONS ("Integrated Processing for Microelectronics Science and Technology" by G. W. Rubloff and D. T. Bordonaro. IBm J. Res. Develop. vol. 36, No. 2, Mar. 1992.*
"Novel Photoresist Stripping Technology Using Ozone/Vaproized Water Mixture", Hitoshi Abe, Hayato Iwamoto, Takayuki, Tadashi Iino, and Glenn W. Gale; IEEE Transactions on Semiconductor Manufacturing, vol. 16, No. 3, Aug. 2003.*

* cited by examiner

*Primary Examiner*—Michael Lebentritt
*Assistant Examiner*—Andre' Stevenson
(74) *Attorney, Agent, or Firm*—Wenderoth, Lind & Ponack, L.L.P.

(57) ABSTRACT

It is the object of the present invention to provide a manufacturing method for a compound semiconductor device capable of removing remaining organic substances without deteriorating a characteristic of the compound semiconductor device, wherein a surface of an i-type AlGaAs schottky layer is cleaned in a state where light is blocked using either one of ozonized ($O_3$) water whose ozone concentration is at most 13 mg/L and hydrogenated ($H_2$) water whose hydrogen ion concentration (pH) is from 6 to 8 inclusive, or using both of the ozonized water and the hydrogenated water after a schottky electrode made of Ti/Al/Ti is evaporated onto the exposed i-type AlGaAs schottky layer and a lift-off operation is performed using a remover.

17 Claims, 3 Drawing Sheets

MANUFACTURING METHOD FOR COMPOUND SEMICONDUCTOR DEVICE

BACKGROUND OF THE INVENTION (1) Field of the Invention

The present invention relates to a manufacturing method for a compound semiconductor device, in particular to a manufacturing method for a compound semiconductor device, the method including a surface-cleaning process after a resist pattern is removed.

(2) Description of the Related Art

Generally speaking, in a lithography process of a manufacturing process for a semiconductor device, a resist pattern is formed on a semiconductor layer, the semiconductor layer is etched using the resist pattern, and the resist pattern is removed using a remover and the like.

In the lithography process, if organic substances such as resist still remain on the semiconductor layer after the resist pattern is removed, these remaining substances result in a film removal and the like. It is possible to cause a problem in terms of credibility. Accordingly, in order to remove remaining organic substances, an $O_2$ plasma etching is performed on the semiconductor layer after the resist is removed (e.g. refer to Ralph E. Williams. "Gallium Arsenide Processing Techniques" (United States), ARTECH HOUSE, INC., 1984). In addition, according to technology disclosed in Japanese Laid-Open Patent Publication application No. 2001-185520, remaining organic substances made of Si on a semiconductor layer are removed by combining ozonized gas, ozonized water and hydrogenated water.

Additionally, in a case where the semiconductor layer is a compound semiconductor layer made of GaAs and the like instead of Si, a desired device characteristic of the compound semiconductor device cannot be obtained when remaining organic substances are removed by $O_2$ plasma etching during a lithography process of the compound semiconductor device having such compound semiconductor layer. That is, the compound semiconductor layer is damaged when the $O_2$ plasma ashing is performed on the semiconductor layer in a state where the compound semiconductor layer is exposed after removal of a resist pattern.

Here, removal of organic substances remaining on a compound semiconductor layer not by $O_2$ plasma ashing but by ozonized gas, ozonized water and hydrogenated water had not been practiced under a consideration of a strong oxidization capability of the ozonized gas, the ozonized water and the hydrogenated water.

SUMMARY OF THE INVENTION

Considering the problem mentioned above, it is an object of the present invention to provide a manufacturing method for a compound semiconductor device capable of removing remaining organic substances without deteriorating a characteristic of the compound semiconductor device.

In order to achieve the object, the manufacturing method of the compound semiconductor device of the present invention comprises a patterning process of forming a resist pattern on a compound semiconductor layer; and a removing process of removing the resist pattern and cleaning a surface of the compound semiconductor layer using at least one of ozonized ($O_3$) water and hydrogenated ($H_2$) water. Here, a concentration of the ozonized water may be 13 mg/L or less. Also, a compound semiconductor layer may have a layer made of GaAs, AlGaAs, InGaAs, InGaP, or InP. Also, the compound semiconductor layer surface to be cleaned may be made of GaAs, AlGaAs, InGaAs, InGaP, or InP.

Consequently, the remaining organic substances can be removed without damaging the compound semiconductor layer so that the manufacturing method for the compound semiconductor device capable of removing the remaining organic substances without deteriorating the characteristic of the compound semiconductor device can be realized.

Here, cleaning of the compound semiconductor layer surface during the removing process may be performed in a state where light is blocked.

As the result, the compound semiconductor layer to be cleaned is not etched by a battery effect so that the manufacturing method for the compound semiconductor device of further preventing a deterioration of the characteristic of the compound semiconductor device can be realized.

Further, during the removing process, the ozonized water and the hydrogenated water may be used for the cleaning.

Consequently, many of the remaining organic substances can be removed by oxidation of ozonized water and deoxidization of the hydrogenated water. Further, remaining fluid on the surface of the compound semiconductor layer can be removed by rinsing with the hydrogenated water. Therefore, the manufacturing method for the compound semiconductor device capable of further cleaning the surface of the compound semiconductor layer can be realized.

As is clear from the above explanation, according to the manufacturing method for the compound semiconductor device of the present invention, remaining organic substances can be removed without deteriorating a characteristic of the compound semiconductor device.

Accordingly, the present invention makes it possible to provide a manufacturing method for a compound semiconductor device capable of removing remaining organic substances without deteriorating a characteristic of the compound semiconductor device. A practical value of the present invention is therefore very high.

As further information about technical background to this application, the disclosure of Japanese Patent Application No. 2004-023238 filed on Jan. 30, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DETAILED DESCRIPTION OF THE PREFERRED EMBODIMENT(S)

Hereafter, a manufacturing method for a compound semiconductor device according to a present embodiment of the present invention is explained with reference to diagrams.

FIGS. 1A to 1G are cross-sectional diagrams of an FET for explaining a lithography process in a manufacturing process of an FET in the present embodiment.

Figure 1A:
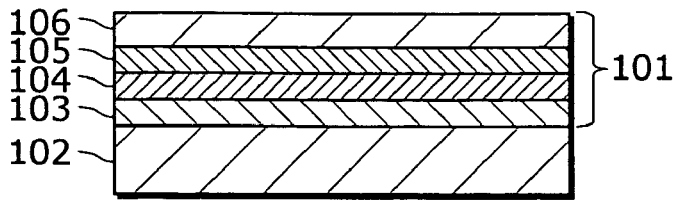
FIGS. 1A to 1G are cross-sectional diagrams of a field effect transistor (hereafter referred to as FET) for explaining a lithography process in a present embodiment of the present invention.

Firstly, as shown in FIG. 1A, on a semi-insulate GaAs substrate 102, an epitaxial layer 101 is generated by epitaxially growing, in sequence, an i-type InGaAs channel layer 103, an n-type AlGaAs electron supply layer 104, an i-type AlGaAs schottky layer 105, and an n-type GaAs ohmic contact layer 106.

Figure 1B:
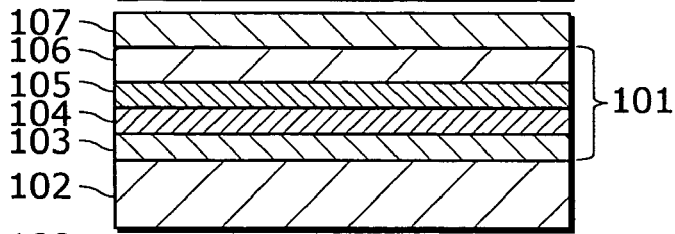

Next, as shown in FIG. 1B, an $SiO_2$ film 107 with a thickness of, for example, 300 nm is formed on the epitaxial layer 101 by performing a plasma CVD method.

Figure 1C:
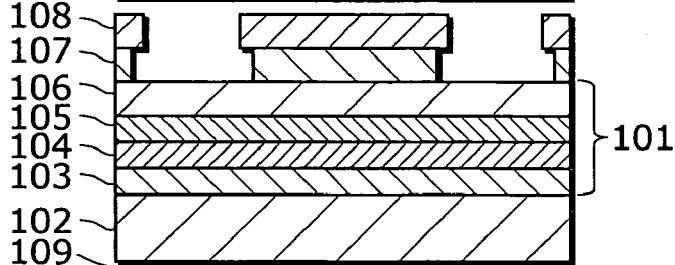

Then, as shown in FIG. 1C, after a resist pattern 108 for forming an ohmic electrode 109 is formed, a predetermined region of the $SiO_2$ film 107 is etched with fluorine using the resist pattern 108 so as to expose the n-type ohmic contact layer 106.

Figure 1D:
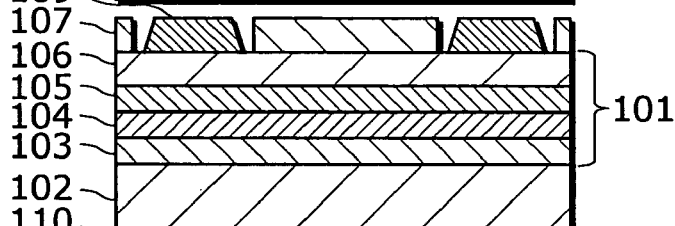

Following that, as shown in FIG. 1D, ohmic electrode 109 made of AuGe/Ni/Au system is evaporated onto the exposed n-type GaAs ohmic contact layer 106, and a lift-off operation is performed using a remover.

Figure 1E:
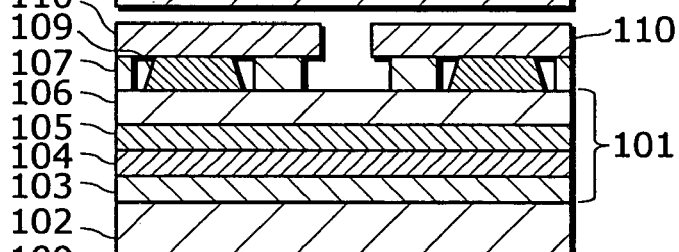

Next, as shown in FIG. 1E, after a resist pattern 110 for forming a schottky electrode 111 is formed, the predetermined region of the $SiO_2$ film 107 is etched with fluorine using the resist pattern 110.

Figure 1F:
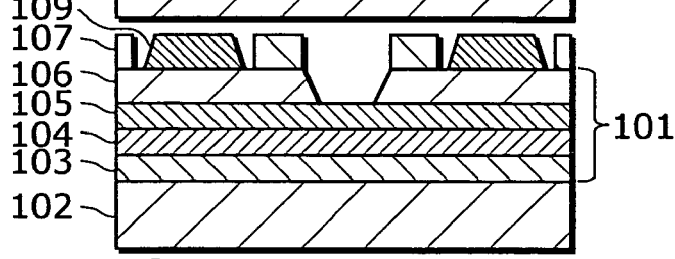

Then, as shown in FIG. 1F, the epitaxial layer 101 is recess-etched and the i-type AlGaAs schottky layer 105 is exposed.

Figure 1G:
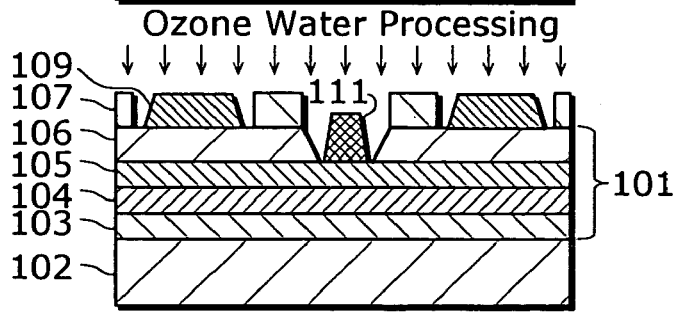

Finally, as shown in FIG. 1G, schottky electrode 111 made of Ti/Al/Ti system is evaporated onto the exposed i-type AlGaAs schottky layer 105, and a lift-off operation is performed using the remover. Further, a surface of the epitaxial layer 101 is cleaned by dipping into ozonized water $(O_3)$ whose ozone concentration is at most 13 mg/L, for example, 5 mg/L at a normal temperature for about 90 sec, and remaining organic substances are removed. Here, cleaning is performed in a state where light is blocked in order to shade the epitaxial layer 101. Here, a pH of the ozonized water is preferred to be from 6 to 8 inclusive. Also, not the ozonized water but hydrogenated water whose concentration is from 6 to 8 inclusive, or hydrogenated water and the ozonized water, for example, hydrogenated water whose hydrogen ion concentration is 7, may be used for cleaning the surface of the epitaxial layer 101. When the surface of the epitaxial layer 101 is cleaned with the hydrogenated water and the ozonized water, a cleaning with the ozonized water or the hydrogenated water is performed after cleaning with the hydrogenated water or the ozonized water. Further, while it is explained that a dipping process with the ozonized water cleans the surface of the epitaxial layer 101, a similar effect is obtained in a spin process that spins the GaAs substrate and discharges ozone water from a nozzle.

Figure 2:
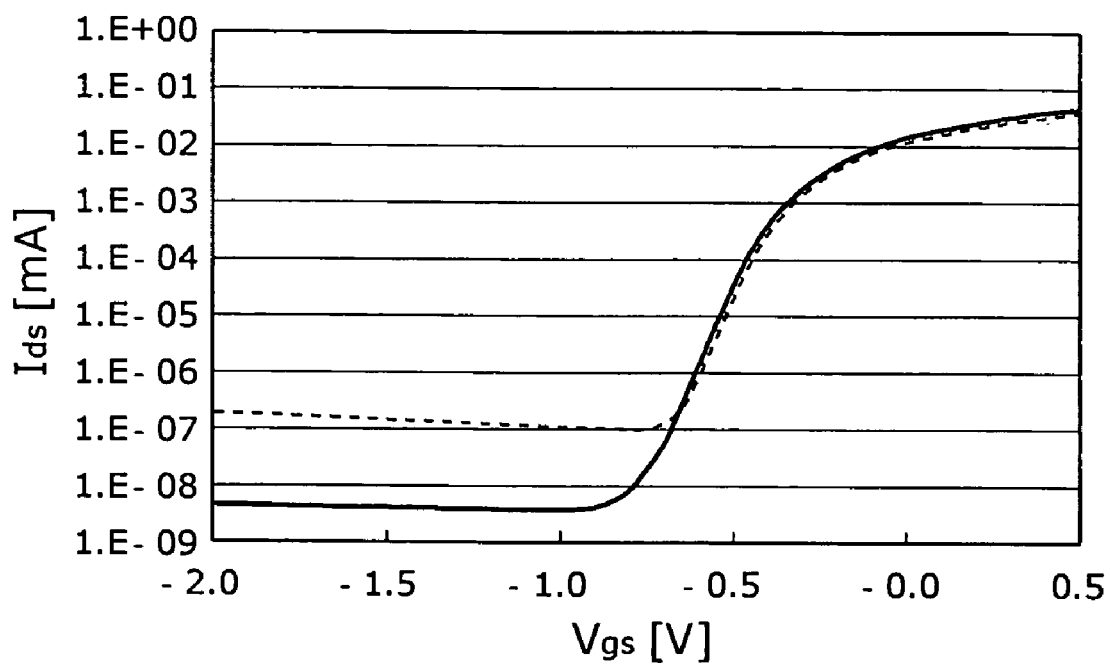
FIG. 2 is a diagram indicating an $I_{ds}$-$V_{gs}$ characteristic of the FET manufactured through the lithography process of the present embodiment.

FIG. 2 is a diagram indicating a drain current $I_{ds}$-gate voltage $V_{gs}$ characteristic that shows a device characteristic of an FET manufactured via a lithography process. Note that, in FIG. 2, a dashed line indicates an $I_{ds}$-$V_{gs}$ characteristic of a conventional FET manufactured by removing remaining organic substances using $O_2$ plasma ashing, and a solid line indicates an $I_{ds}$-$V_{gs}$ characteristic of the FET of the present invention manufactured by removing remaining organic substances using ozonized water.

FIG. 2 shows that the FET of the present invention can obtain a better pinch-off characteristic as compared to the conventional FET. This is because, in conventional cleaning by the $O_2$ plasma ashing, plasma damages the epitaxial layer 101 and leak components increase, while in cleaning with ozonized water in the present invention, the surface of the epitaxial layer 101 is not damaged since plasma is not used.

Figure 3:
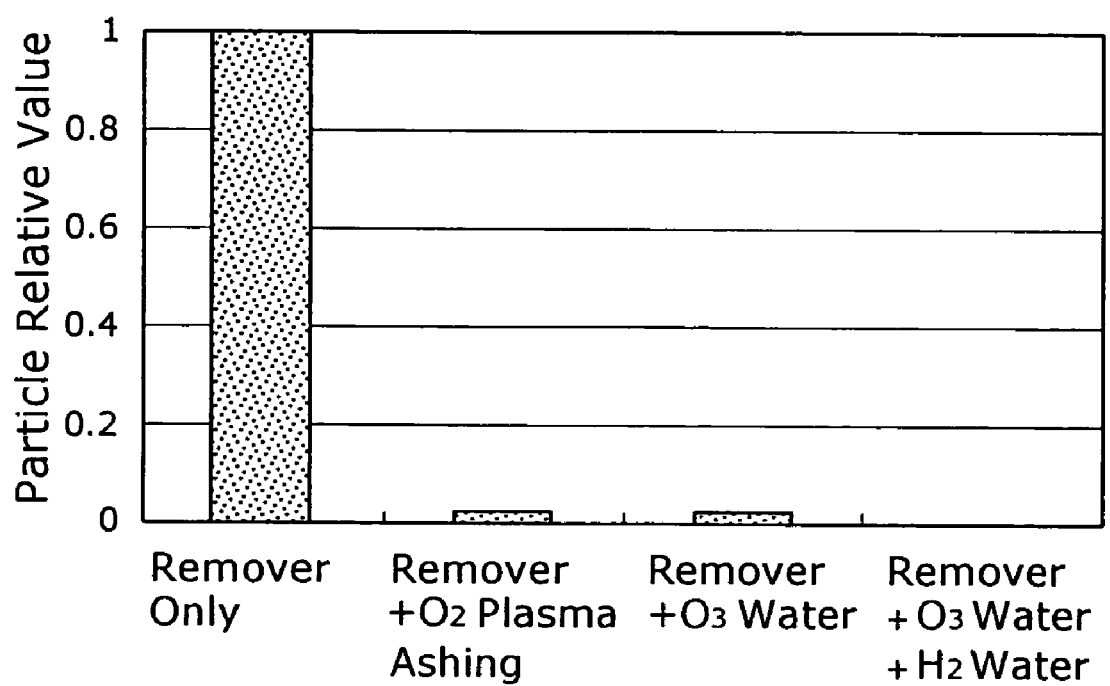
FIG. 3 is a diagram indicating a result of comparing a number of particles of the FET manufactured by the lithography process in the present embodiment with a number of particles of an FET manufactured by a conventional lithography process.

FIG. 3 is a diagram indicating a result of comparing i) a number of particles of an FET manufactured without removing remaining organic substances in the process shown in FIG. 1G, ii) a number of particles of an FET manufactured by removing remaining organic substances by $O_2$ plasma ashing, iii) a number of particles of an FET manufactured by removing remaining organic substances with ozonized water only, with iv) a number of particles of an FET manufactured by removing remaining organic substances with ozonized water and hydrogenated water. Here, in FIG. 3, they are compared by converting the number of particles of the FET manufactured without removing the remaining organic substances into 1.

FIG. 3 shows that removal of the remaining organic substances with the ozonized water reduces the number of particles compared to the case where the remaining organic substances are not removed, and that a reduction rate is as much as that of the removal of the remaining organic substances by the $O_2$ plasma ashing. Moreover, removal of the remaining organic substances with the ozonized water and the hydrogenated water reduces the number of particles compared to the case where the remaining organic substances are removed with the ozonized water only. This is because oxidation of the ozonized water is combined with deoxidization of the hydrogenated water so as to remove more remaining organic substances.

Figure 4:
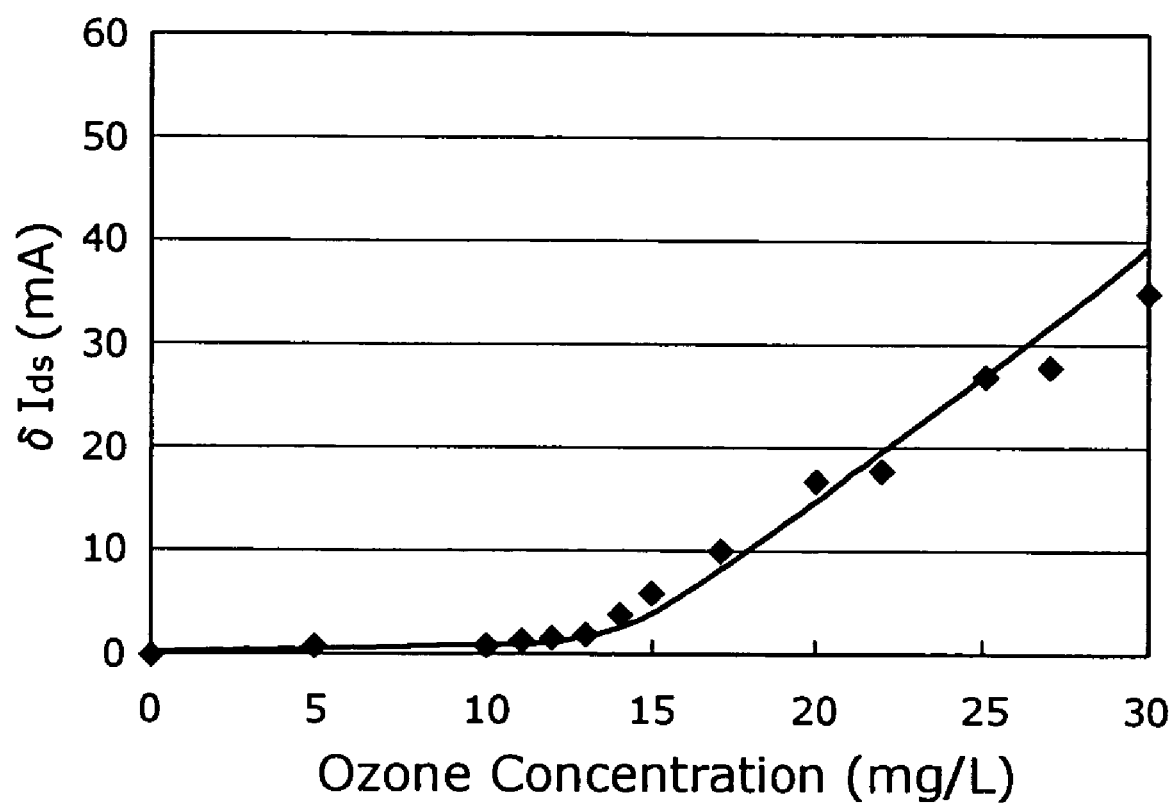
FIG. 4 is a diagram indicating an $I_{ds}$ variation of the FET in a case where an ozone concentration of ozonized water is changed during the lithography process of the present embodiment.

FIG. 4 is a diagram indicating an $I_{ds}$ variation ($\delta I_{ds}$ in FIG. 4) of an FET in a case where ozone concentration of the ozonized water is changed in the process shown in FIG. 1G. That is, it is a diagram indicating an ozone concentration dependency of $I_{ds}$.

FIG. 4 shows that the $I_{ds}$ variation becomes larger when the ozone concentration becomes greater than 13 mg/L. This is because oxidation on the surface of the epitaxial layer 101 progresses as the ozone concentration becomes too high, a distance between the schottky electrode 111 and the i-type InGaAs channel layer 103 changes, and the $I_{ds}$ changes accordingly. Therefore, according to the manufacturing method for the FET of the present invention, the ozone concentration is at most 13 mg/L so that the remaining organic substances can be removed without changing the $I_{ds}$.

As described above, according to performing a lithography process for production of an FET in the present embodiment, the remaining organic substances are removed with the ozonized water whose ozone concentration is at most 13 mg/L or whose pH is from 6 to 8 inclusive, and hydrogenated water whose hydrogen ion concentration is from 6 to 8 inclusive. Therefore, the remaining organic substances can be removed without damaging an epitaxial layer so that the lithography process for production of the FET in the present embodiment can realize a lithography process for production of the FET that can remove the remaining organic substances without deteriorating a characteristic of the FET.

Also, according to the lithography process for production of the FET in the present embodiment, cleaning is performed in a state where light is blocked to shade the epitaxial layer 101. Consequently, the epitaxial layer is not etched by a battery effect so that the lithography process for production of the FET in the present embodiment can realize a lithography process for production of the FET that can prevent further deterioration of the characteristic of the FET.

Additionally, according to the lithography process for production of the FET in the present embodiment, cleaning is performed using both of ozonized water and the hydrogenated water. Therefore, many of remaining organic substances can be removed due to oxidation of the ozonized water and deoxidization of the hydrogenated water. Further, remaining fluid on a surface of a compound semiconductor layer can be removed by rinsing with hydrogenated water so that a lithography process for production of the FET in the present embodiment can realize the lithography process of the FET that can clean a surface of the epitaxial layer more.

Here, in the lithography process for production of the FET in the present embodiment, the surface of the epitaxial layer 101 is cleaned after the schottky electrode 111 is formed. However, the surface of the epitaxial layer 101 can be cleaned, even after forming the ohmic electrode 109, with ozonized water whose ozone concentration is at most 13 mg/L or whose pH is from 6 to 8 inclusive, with hydrogenated water whose hydrogen ion concentration is from 6 to 8 inclusive, or with both of the ozonized water and the hydrogenated water. Consequently, formation of oxides on a surface of the n-type GaAs ohmic contact layer 106 can be prevented so that an increase of a contact resistance is prevented and deterioration of the characteristic of the FET is also prevented.

Further, in the present embodiment, a compound semiconductor device is considered as the FET. However, the compound semiconductor device does not have to be limited to the FET, and other compound semiconductor devices may be used unless a lithography process is used in the manufacturing process.

Moreover, in the present embodiment, the compound semiconductor device has a layer made of GaAs, AlGaAs and InGaAs. However, the compound semiconductor device may have a layer made of other compound semiconductor device materials, for example, such as InP or InGaP.

Additionally, in the present embodiment, a layer exposed for cleaning is a compound semiconductor layer made of AlGaAs or GaAs. However, the layer exposed for cleaning may be a compound semiconductor layer made of other compound semiconductor materials such as InGaAs, InGaP or InP.

Although only an exemplary embodiment of this invention has been described in detail above, those skilled in the art will readily appreciate that many modifications are possible in the exemplary embodiment without materially departing from novel teachings and advantages of this invention. Accordingly, all such modifications are intended to be included within the scope of this invention.

INDUSTRIAL APPLICABILITY

The present invention can be used for a manufacturing method for a compound semiconductor device, in particular for a lithography process and the like in a manufacturing process for the compound semiconductor device.

What is claimed is:

1. A method for manufacturing a compound semiconductor device that is a field-effect transistor made up of a compound semiconductor layer including GaAs, AlGaAs, InGaAs, InGaP or InP, said method comprising:
    forming a resist pattern on said compound semiconductor layer;
    removing said resist pattern; and
    cleaning one of a contact layer and a schottky layer of said compound semiconductor layer using both ozone-containing water and hydrogen-containing water.

2. The method according to claim 1, wherein
    cleaning said one of said contact layer and said schottky layer comprises cleaning said one of said contact layer and said schottky layer using ozone-containing water, having an ozone concentration of at most 13 mg/L, and said hydrogen-containing water.

3. The method according to claim 2, wherein
    cleaning said one of said contact layer and said schottky layer comprises cleaning said one of said contact layer and said schottky layer in a state where light is blocked.

4. The method according to claim 3, wherein
    said one of said contact layer and said schottky layer includes GaAs, AlGaAs, InGaAs, InGaP or InP.

5. The method according to claim 4, wherein
    cleaning said one of said contact layer and said schottky layer comprises cleaning a schottky layer on which a gate electrode is formed.

6. The method according to claim 3, wherein
    cleaning said one of said contact layer and said schottky layer comprises cleaning a schottky layer on which a gate electrode is formed.

7. The method according to claim 2, wherein said one of said contact layer and said schottky layer includes GaAs, AlGaAs, InGaAs, InGaP or InP.

8. The method according to claim 7, wherein
    cleaning said one of said contact layer and said schottky layer comprises cleaning a schottky layer on which a gate electrode is formed.

9. The method according to claim 2, wherein
    cleaning said one of said contact layer and said schottky layer comprises cleaning a schottky layer on which a gate electrode is formed.

10. The method according to claim 1, wherein
    said one of said contact layer and said schottky layer includes GaAs, AlGaAs, InGaAs, InGaP or InP.

11. The method according to claim 10, wherein
    cleaning said one of said contact layer and said schottky layer comprises cleaning a schottky layer on which a gate electrode is formed.

12. The method according to claim 1, wherein
    cleaning said one of said contact layer and said schottky layer comprises cleaning said one of said contact layer and said schottky layer in a state where light is blocked.

13. The method according to claim 12, wherein
    said one of said contact layer and said schottky layer includes GaAs, AlGaAs, InGaAs, InGaP or InP.

14. The method according to claim 13, wherein
    cleaning said one of said contact layer and said schottky layer comprises cleaning a schottky layer on which a gate electrode is formed.

15. The method according to claim 1, wherein
    cleaning said one of said contact layer and said schottky layer comprises cleaning a schottky layer on which a gate electrode is formed.

16. The method according to claim 15, wherein
    cleaning said one of said contact layer and said schottky layer comprises cleaning said one of said contact layer and said schottky layer in a state where light is blocked.

17. The method according to claim 1, wherein
    cleaning said one of said contact layer and said schottky layer comprises cleaning said one of said contact layer and said schottky layer by an oxidation effect of said ozone-containing water or a deoxidation effect of said hydrogen-containing water.

* * * * *